(12) United States Patent
Takagaki et al.

(10) Patent No.: US 9,390,955 B2
(45) Date of Patent: Jul. 12, 2016

(54) HANDLE SUBSTRATE AND COMPOSITE WAFER FOR SEMICONDUCTOR DEVICE

(71) Applicant: NGK INSULATORS, LTD., Aichi-prefecture (JP)

(72) Inventors: Tatsuro Takagaki, Nagoya (JP); Yasunori Iwasaki, Kitanagoya (JP); Sugio Miyazawa, Kasugai (JP); Akiyoshi Ide, Kasugai (JP); Hirokazu Nakanishi, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/829,808

(22) Filed: Aug. 19, 2015

(65) Prior Publication Data

US 2015/0357221 A1    Dec. 10, 2015

Related U.S. Application Data

(63) Continuation of application No. PCT/JP2014/077465, filed on Oct. 15, 2014.

(30) Foreign Application Priority Data

Jan. 6, 2014 (JP) ................................ 2014-000246

(51) Int. Cl.
| | | |
|---|---|---|
| H01L 21/683 | (2006.01) | |
| H01L 29/16 | (2006.01) | |
| C30B 29/06 | (2006.01) | |
| C04B 35/115 | (2006.01) | |
| C04B 35/111 | (2006.01) | |
| H01L 27/12 | (2006.01) | |

(52) U.S. Cl.
CPC ............ *H01L 21/683* (2013.01); *C04B 35/111* (2013.01); *C04B 35/115* (2013.01); *C30B 29/06* (2013.01); *H01L 27/12* (2013.01); *H01L 29/16* (2013.01); *C04B 2235/3206* (2013.01); *C04B 2235/3225* (2013.01); *C04B 2235/5409* (2013.01); *C04B 2235/5445* (2013.01); *C04B 2235/6023* (2013.01);
(Continued)

(58) Field of Classification Search
CPC .............. Y10T 428/21; Y10T 428/219; Y10T 428/24777
See application file for complete search history.

(56) References Cited

U.S. PATENT DOCUMENTS

| | | |
|---|---|---|
| 8,088,670 B2 | 1/2012 | Akiyama et al. |
| 8,975,159 B2 | 3/2015 | Akiyama |
| 2004/0124413 A1 | 7/2004 | Arai et al. |

FOREIGN PATENT DOCUMENTS

| | | |
|---|---|---|
| EP | 2514576 A1 | 10/2012 |
| EP | 2736065 A1 | 5/2014 |

(Continued)

OTHER PUBLICATIONS

Morimoto, T., et. al., "New Measurement Method for Cross-section of Wafer Edge Using Surface-normal Sensing Technique," Kobe Steel Engineering Report, vol. 57, No. 3, Dec. 2007, pp. 43-48.
(Continued)

*Primary Examiner* — Gerard Higgins
(74) *Attorney, Agent, or Firm* — Cermak Nakajima & McGowan LLP; Tomoko Nakajima

(57) ABSTRACT

In a handle substrate for a composite wafer for a semiconductor, particles from the wafer with a notch formed therein are reduced. The handle substrate 1A or 1B for the composite wafer for the semiconductor is formed of a polycrystalline ceramic sintered body, and includes a notch 2A or 2B in its outer peripheral portion. The notch is formed with an as-sintered surface.

8 Claims, 6 Drawing Sheets

(52) U.S. Cl.
CPC .. *C04B 2235/6025* (2013.01); *C04B 2235/612* (2013.01); *C04B 2235/6582* (2013.01); *C04B 2235/661* (2013.01); *C04B 2235/662* (2013.01); *C04B 2235/945* (2013.01); *C04B 2235/963* (2013.01); *Y10T 428/21* (2015.01); *Y10T 428/219* (2015.01); *Y10T 428/24777* (2015.01)

(56) References Cited

FOREIGN PATENT DOCUMENTS

| | | |
|---|---|---|
| JP | 5-160240 A | 6/1993 |
| JP | 2004-207606 A | 7/2004 |
| JP | 2006-059853 A | 3/2006 |
| JP | 2006-100705 A | 4/2006 |
| JP | 2008-288556 A | 11/2008 |
| WO | WO2010/128666 A1 | 11/2010 |

OTHER PUBLICATIONS

International Search Report and Written Opinion for PCT Patent App. No. PCT/JP2014/077465 (Jan. 20, 2015) with English language translations.
Search Report for European Patent App. No. 14877410.2 (Jan. 18, 2016).

Unit length of straight line (for example 500 μm)

Number of grains = 22, 23, 19
(at three different positions)

HANDLE SUBSTRATE AND COMPOSITE WAFER FOR SEMICONDUCTOR DEVICE

FIELD OF THE INVENTION

The present invention relates to a handle substrate and a composite wafer for a semiconductor.

BACKGROUND ARTS

According to prior arts, it has been known to obtain SOI including a handle substrate composed of a transparent and insulating substrate and called Silicon on Quartz (SOQ), Silicon on Glass (SOG) and Silicon on Sapphire (SOS). It has been also known an adhered wafer obtained by bonding a transparent wide-gap semiconductor, including GaN, ZnO, diamond, MN or the like, to a donor substrate such as silicon. SOQ, SOG, SOS and the like are expected for applications such as a projector and high frequency device due to the insulating property and transparency of the handle substrate. Further, the composite wafer, which is obtained by adhering a thin film of the wide-gap semiconductor to the handle substrate, is expected in applications such as a high performance laser and power device.

Such composite wafer for semiconductor is composed of the handle substrate and donor substrate, and the handle and donor substrates are generally made of single crystal materials. According to prior arts, it was generally performed a method of forming a silicon layer on a base substrate by epitaxial growth. It has recently developed a method of directly bonding them to contribute to the improvement of performance of a semiconductor device. That is, such handle and donor substrates are bonded through a bonding layer or an adhesive layer or directly bonded with each other.

On the other hand, it has been used a semiconductor (mainly silicon) as a substrate forming CMOS. As it is applied several hundreds of processing steps and equipments for them, it is decided a standard commonly applied to substrate wafers (SEMI: Semiconductor Equipment and Materials International).

Particularly, formation of CMOS transistors has been performed using an SOS (silicon on sapphire) substrate. As this wafer is produced by joining silicon with sapphire, it is required that the shape of silicon is in conformity with the shape of sapphire.

It is generally used a silicon wafer of plane orientation of <100>, and it is important to recognize the plane orientation for the matching with mask pattern. It is indicated in a method of "notch" according to the "SEMI standard, and the specification of the notch is defined (non-patent document 1).

Further, as the development of the bonding technique, it has been proposed various kinds of handle substrates made of materials, other than sapphire, such as quartz, glass and alumina (Patent documents 1, 2, 3 and 4).

Further, according to patent document 5, a cover wafer is made of a sintered body of yttria, ytterbium oxide, lanthanum oxide or ruthenium oxide free from both of silicon and aluminum, and the cover wafer is mounted on a substrate holder of a semiconductor production chamber to prevent generation of a silicon compound or aluminum compound. Here, a V-notch is formed in the cover wafer (0022).

PRIOR DOCUMENTS (Patent document 1) WO 2010/128666 A1
(Patent document 2) Japanese Patent Publication No. H05-160240A
(Patent document 3) Japanese Patent Publication No. H05-160240A
(Patent document 4) Japanese Patent Publication No. 2008-288556A
(Patent document 5) Japanese Patent Publication No. 2006-100705A

NON-PATENT DOCUMENTS (Non-Patent document 1) "New Measurement Method for Cross-section of Wafer Edge Using Surface-normal Sensing Technique" Kobe Steel engineering Report, Vol. 57 No. 3 (December. 2007), pages 43 to 48

SUMMARY OF THE INVENTION

According to a wafer, such as an 8-inch wafer, based on SEMI standards, it is necessary to form a notch as a representation of crystal orientation. However, since the toughness of sapphire is low, in the case the notch is formed in the wafer of sapphire, tipping may occur or particles may be generated from ground parts. It is thereby difficult to form the good notch corresponding to SEMI standards in the wafer of sapphire.

On the other hand, as described in patent document 5, it may be considered that the notch is formed in a wafer made of a ceramic material such as yttria. As the toughness of such ceramics is higher than that of sapphire, it is considered that the notch can be formed easier.

However, as the notch was actually formed by grinding or the like, the number of the particles after cleaning was proved to be large. During the subsequent semiconductor process, such as a step after forming a composite wafer such as SOS, fracture of the wafer or particle generation would be caused due to shocks of heat, moving or the like to lower the yield of the subsequent steps.

An object of the present invention is, in a handle substrate of a composite wafer for a semiconductor, to reduce particles from the wafer after forming a notch.

The present invention provides a handle substrate for a composite wafer for a semiconductor; the handle substrate comprising a polycrystalline ceramic sintered body. The handle substrate comprises an outer peripheral portion comprising a notch, and the notch comprises an as-sintered surface.

The present invention further provides a composite wafer for a semiconductor. The composite substrate includes the handle substrate and a donor substrate bonded to a bonding face of the handle substrate.

By utilizing a polycrystalline ceramic sintered body as a material of a handle substrate, it was expected that the toughness of the material could be improved and a notch could be easily formed in the handle substrate while tipping and particles are prevented. However, according to experimental results of the inventors, in the case that the notch is formed in the handle substrate made of the polycrystalline ceramic sintered body, it is proved that the number of the particles after cleaning is large and defects would occur in the subsequent semiconductor process.

Thus, the inventors tried to form the handle substrate with the polycrystalline ceramic sintered body and to form the notch by a sintered surface (as-fired surface). As a result, it was found that the particles remaining after cleaning can be considerably reduced. Such formation of the notch with the as-sintered surface can be realized by modifying the shape of a mold for molding the ceramic molding material into the handle substrate.

EMBODIMENTS FOR CARRYING OUT THE INVENTION

Figure 1A:
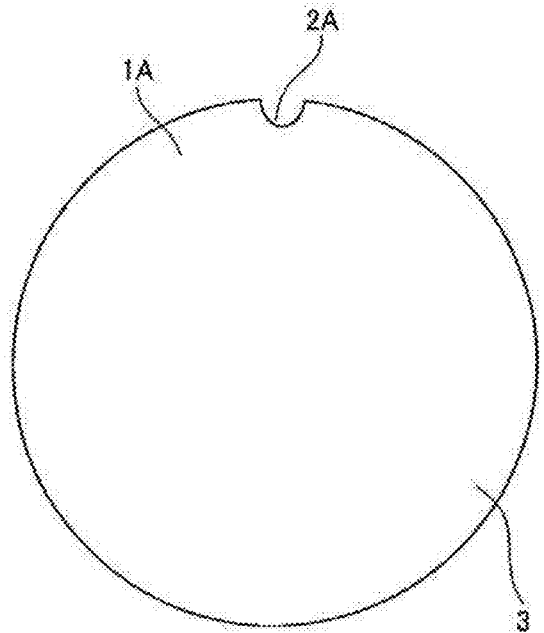
FIG. 1(a) and (b) are plan views showing handle substrates 1A and 1B with notches formed therein, respectively.

The present invention will be described further in detail, referring to the drawings appropriately.

(Applications)

The composite wafer of the present invention may be applied to a light emitting device for a projector, high frequency device, high performance laser, power device, logic IC or the like.

(Donor Substrate)

The composite substrate includes the inventive handle substrate and a donor substrate.

Materials of the donor substrates are not particularly limited, and may preferably be selected from the group consisting of silicon, aluminum nitride, gallium nitride, zinc oxide and diamond.

The donor substrate may include the above described material whose surface may include an oxide film. It is because the effect of preventing channeling of implanted ions by performing ion implantation through the oxide film. The oxide film preferably has a thickness of 50 to 500 nm. Such donor substrate including the oxide film is also categorized as the donor substrate, and it is called donor substrate unless specifically indicated.

(Handle Substrate)

Figure 1B:
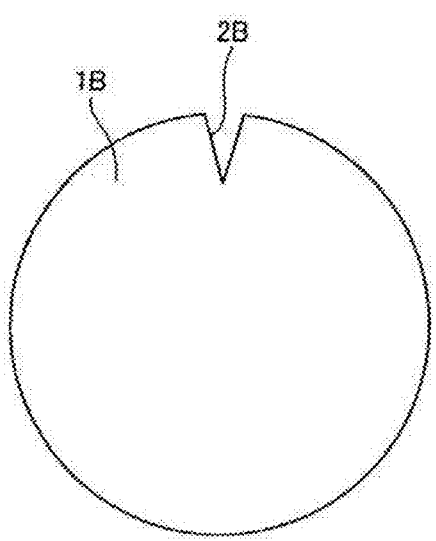

As shown in FIGS. 1(a) and 1(b), each of handle substrates 1A and 1B has a shape of a circle, for example, and a notch 2A or 2B is formed at a single position. The notch 2A shown in FIG. 1(a) has a shape of U-character and the notch 2B shown in FIG. 1(b) has a shape of V-character. These notches are used for detecting the position and orientation of a wafer, during various kinds of manipulations in production steps of a semiconductor device. Particularly in the case of a wafer having a size of 8 inches or larger, such notches are introduced as a general detecting means instead of an orientation flat.

Here, according to the present invention, the notch of the handle substrate is formed with an as-sintered surface of a polycrystalline ceramic sintered body. The as-sintered surface means a surface obtained in the sintering of a ceramic molded body and which has not been subjected to mechanical surface processing.

Figure 5:
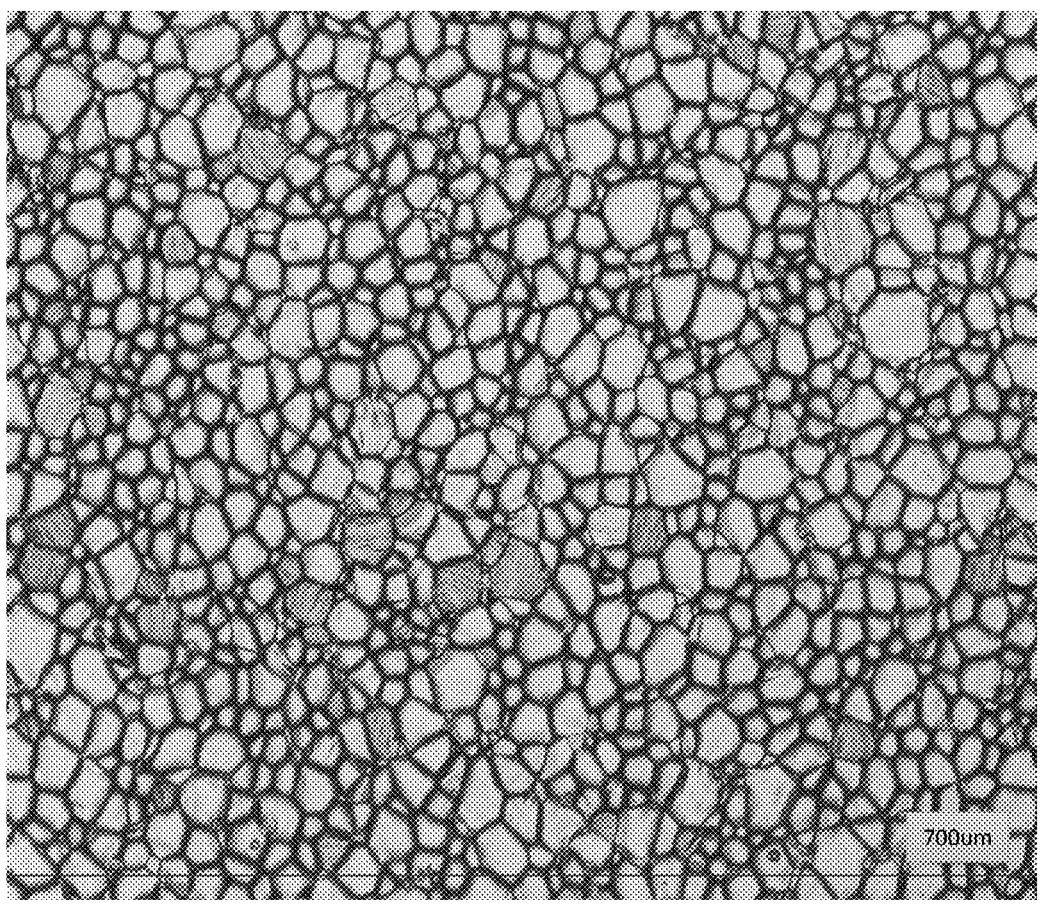
FIG. 5 is a photograph taken by an optical microscope of a surface (as-sintered surface) of a notch.
Figure 6:
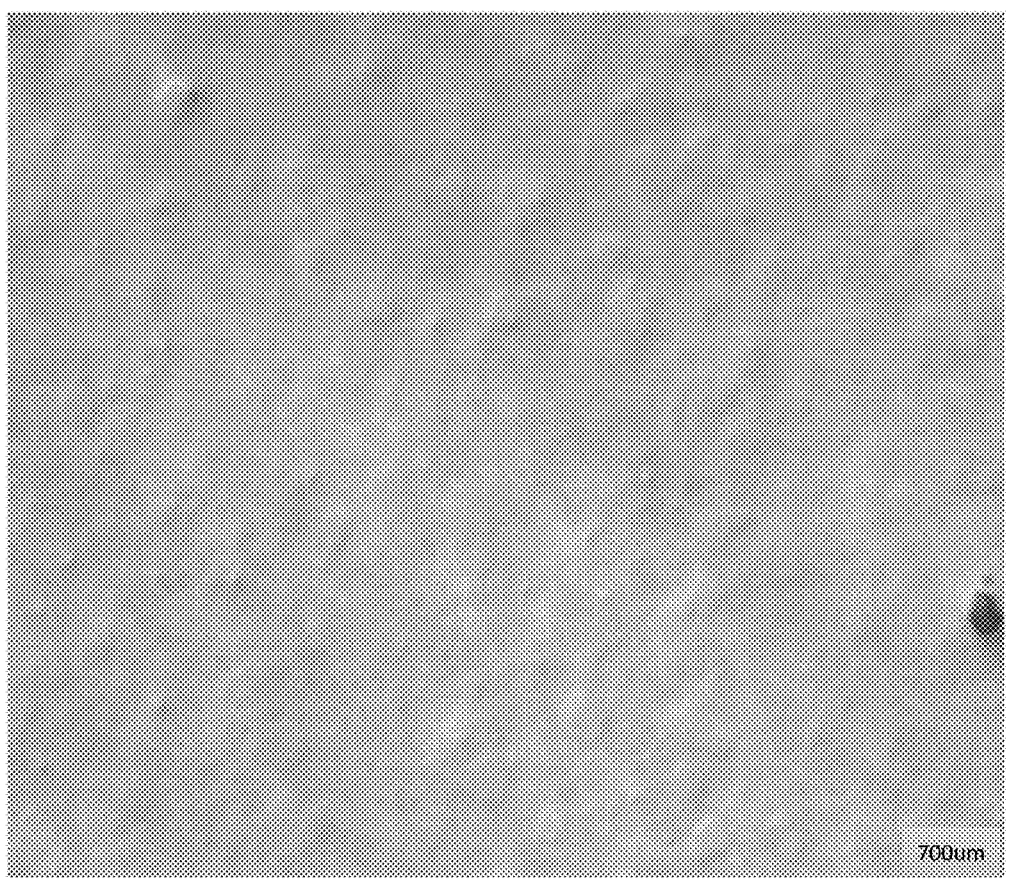
FIG. 6 is a photograph taken by an optical microscope of a surface (surface polished by CMP) of a notch.

Here, according to the as-sintered surface, different from a polished surface, it is possible to observe grain boundaries derived from ceramic polycrystals. The difference of the as-sintered surface and polished surface can be understood by observation by means of an optical microscope (at a magnification of 200). FIG. 5 shows an example of a taken image of the as-sintered surface, and FIG. 6 shows an example of a taken image of the surface polished by CMP.

It can be seen that many bright grains are shown and arranged in the as-sintered surface. Then, between the adjacent grains, relatively dark line-shaped portions are formed. The line-shaped portions are connected to each other to form network structure in a plan view which forms a continuous phase. On the other hand, the grains are surrounded by the line-shaped portions, respectively, to form dispersed phases. As the grains are slightly higher than grain boundaries at the as-sintered surface, light is irradiated easily onto the grains to make them bright.

On the other hand, the contrast of bright and dark portions is smaller as a whole in the polished surface. This is because surfaces of many grains present on the as-sintered surface are polished and made lower so that the height difference of the grain surface and boundary becomes smaller. As a result, there are observed many protrusions higher than the surroundings, and slightly darker regions are observed around the protrusions. It is considered that the protrusions approximately correspond to grains and the slightly darker regions adjacent to the protrusions approximately correspond to grain boundaries. However, the contrast of the brighter regions and darker regions is small and the outlines of the grain boundaries are not clear. As a result, on the polished surface, slightly dark regions are present adjacent to the grain and considered to be the grain boundaries. However, the dark regions do not form network structure in a plan view and do not form continuous phase. Further, the grains do not form dispersed phases surrounded by the dark regions.

It is difficult to process the notch due to its shape, and particles and fine cracks tend to occur during the grinding and polishing. It is thus very effective to make the notch formed by the as-sintered surface.

For example, in the case of the orientation flat generally used in a 6-inch wafer, particles and cracks do not tend to occur due to its shape. In this respect, the case of the orientation flat is different from that in the present invention.

According to a preferred embodiment, the surface roughness Ra of the as-sintered surface is 0.5 μm or smaller, more preferably be 0.4 μm or smaller and most preferably be 0.2 μm or smaller. Here, Ra of the as-sintered surface is a value obtained by taking an image in a visual field of 70 μm×70 μm of the as-sintered surface by means of an AFM (atomic force microscope) and by calculating the value according to JIS B0601.

Besides, the surface roughness Ra of the surface of the notch, which can be formed by polishing, is 0.7 μm or larger.

According to a preferred embodiment, the surface roughness Ra of the bonding face 3 of the handle substrate may preferably be 7 nm or smaller and more preferably be 2 nm or smaller. If this is too large, the bonding strength of the donor substrate is lowered due to intermolecular force. It may more preferably be 1 nm or smaller. Besides, this Ra is a value obtained by taking an image of the bonding face 3 by means of an AFM(atomic force microscope) in a visual field of 70 μm×70 μm and by calculating the value according to JIS B0601.

The average grain size of crystal grains of a sintered body forming the handle substrate may preferably be 10 to 50 μm and more preferably be 20 t0 40 μm.

Here, the average grain size of the crystal grains is measured as follows.

(1) A cross section of a polycrystalline ceramic sintered body is subjected to mirror face polishing and thermal etching to sharpen grain boundaries and a microscopic image (magnification of 100 to 200) is taken to count a number of grains through which a straight line with an unit length pass. This procedure is repeated at different three positions. Besides, the unit length is in a range of 500 to 1000 μm.

(2) It is calculated an average of the numbers of the grains at the three positions measured.
(3) The average grain size is calculated according to the following formula.

$$D=(4/\pi) \times (L/n) \quad \text{(Calculation formula)}$$

"D: The average grain size, L: Unit length of the straight line, n: Average of the numbers of grains at the three positions)

Figure 2:
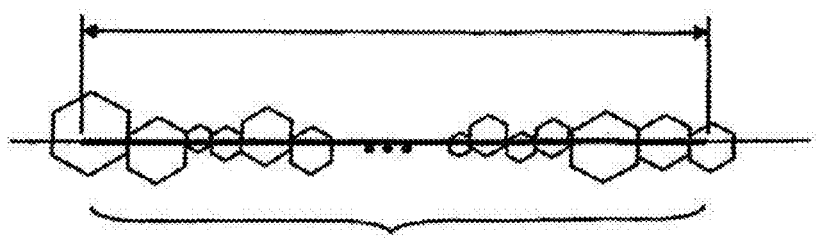
FIG. 2 is a diagram schematically showing an example of calculating method of an average grain size.

FIG. 2 shows an example of the calculation of the average size. It is provided that the numbers of the grains, across which the straight line of a unit length (for example 500 μm) passes, at the different three positions are 22, 23 and 19, respectively. In this case, the average grains size D is 29.9 μm, according to the calculation formula as described above;

$$D=(4/\pi) \times [500/\{(22+23+19)/3\}].$$

The polycrystalline ceramic sintered body forming the handle substrate may preferably be a ceramic sintered body containing aluminum atom or silica atom, and more preferably be alumina, aluminum nitride, silicon nitride or silicon carbide.

According to a preferred embodiment, the polycrystalline ceramic sintered body forming the handle substrate is produced by sintering raw material of ceramic powder having a purity of 99.9 percent or higher.

In the case of translucent alumina, to high-purity alumina powder having a purity of 99.9 percent or higher (preferably 99.95 percent or higher), 100 ppm or higher and 300 ppm or lower of magnesium oxide powder is added. Such high-purity alumina powder includes high-purity alumina powder produced by Taimei Chemical Industries Corporation. Further, the purity and average particle size of the magnesium oxide powder may preferably be 99.9 percent or higher and 0.3 μm or smaller, respectively.

A method of molding the polycrystalline ceramic sintered body is not particularly limited, and may be an optional process such as doctor blade, extrusion, gel cast molding or the like. Most preferably, a blank substrate is produced utilizing gel cast molding. Alternatively, a ceramic tape molded body may be subjected to die cutting to produce a molded body using a metal mold having a desired shape for shaping the notch. The molded body may be sintered to obtain the polycrystalline ceramic sintered body. At this time, the as-sintered surface can be formed by die cutting process of the tape molded body.

Figure 3:
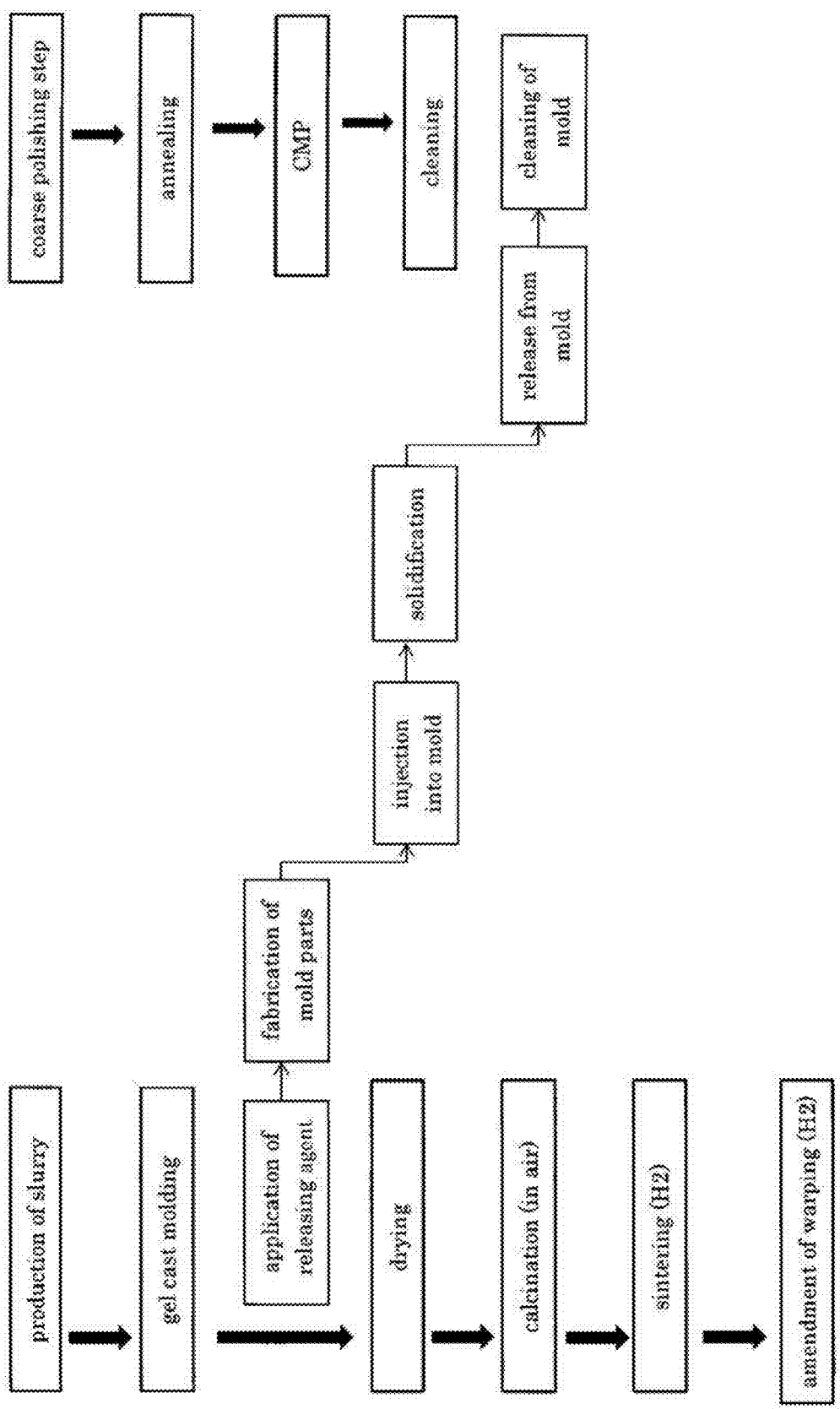
FIG. 3 is a chart illustrating production steps of a handle substrate.

According to a preferred embodiment, as shown in FIG. 3, it is produced slurry containing ceramic powder, a dispersing agent and gelling agent, and then the slurry is injected into a mold and gelled to obtain a molded body. Here, at the time of gel cast molding, a releasing agent is applied onto mold parts, the mold parts are then fabricated into the mold and the slurry is injected into the mold. Then, the gel is solidified in the mold to obtain a molded body and the molded body is released from the mold. The mold is then cleaned. The gel molded body is sintered to obtain the blank substrate.

According to the present invention, inner shape of the mold is adjusted so that the notch is formed in the molded body.

The gel molded body is then dried, preferably calcined in air and then sintered under hydrogen atmosphere. The sintering temperature during the sintering may preferably be 1700 to 1900° C. and more preferably be 1750 to 1850° C., on the viewpoint of densification of the sintered body.

Further, after a sufficiently dense sintered body is generated in the sintering, an annealing process may be further performed to reduce the warping. The annealing temperature may preferably be in a range of the maximum temperature during the sintering ±100° C. and the maximum temperature may preferably be 1900° C. or lower, on the viewpoint of preventing the deformation and abnormal growth of grains and of facilitating the discharge of a sintering aid. Further, the time period of the annealing may preferably be 1 to 6 hours.

Further, the annealing temperature may preferably be in a range of the maximum temperature during the sintering +0° C. to the maximum temperature during the sintering +100° C.

The thus obtained blank substrate is subjected to precise polishing to make Ra of the bonding face 3 smaller. As such precise polishing, CMP(Chemical mechanical polishing) is commonly used. As the polishing slurry, it is used slurry containing alkaline or neutral solution and abrasives with a grain size of 30 nm to 200 nm dispersed therein. As a material of the abrasive, silica, alumina, diamond, zirconia and ceria are listed, and they can be used alone or in combination. Further, as a polishing pad, solid urethane pad, non-woven cloth pad, suede pad are listed.

Further, an annealing process may preferably be performed before preforming final polishing process and after rough polishing process. The annealing process may be performed under atmospheric gas such as air, hydrogen, nitrogen, argon or under vacuum. The temperature and time period of the annealing may preferably be made 1200 to 1600° C. and 2 to 12 hours, respectively. It is thus possible to prevent the deterioration of the flatness of the surface and to facilitate the discharge of the sintering aid.

(Composite Wafer)

Figure 4A:
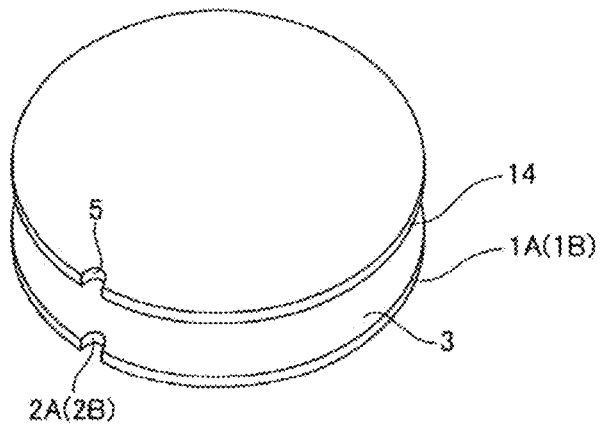
FIGS. 4(a), (b) and (c) are perspective views illustrating procedure of producing a composite wafer, respectively.
Figure 4B:
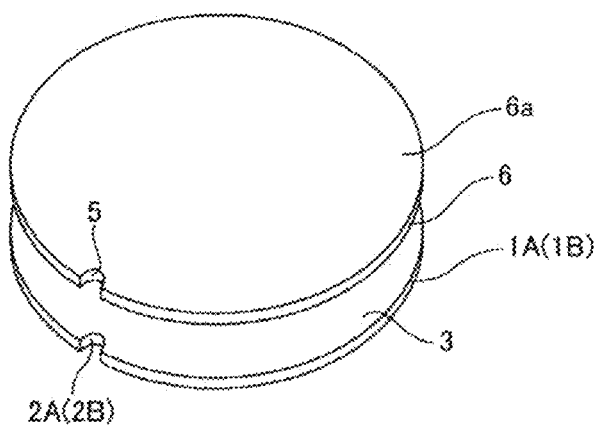
Figure 4C:
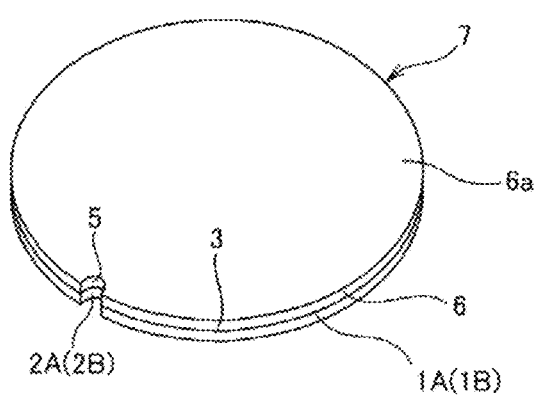

The composite wafer 7 is composed of a handle substrate 1A(1B) and a donor substrate 6, as shown in FIG. 4(c).

First, it is prepared a handle substrate 1A (1B) having a notch 2A (2B) and predetermined diameter and thickness (FIG. 4(a)). It is further prepared a semiconductor substrate 14 having the same diameter as the handle substrate 5 and a notch 5. Then, the semiconductor substrate 14 is thinned to a predetermined thickness, by ion implantation or polishing, to obtain a donor substrate 6, which is then bonded to the handle substrate to obtain the composite wafer 7 (refer to FIG. 4(c)).

In the case that the semiconductor substrate 14 is thinned by ion implantation method, ions are implanted into the semiconductor substrate 14 in advance, which is then bonded to the handle substrate 1A(1B). Thereafter, a part of the semiconductor substrate 14 is mechanically or thermally separated. For reducing damages of the semiconductor substrate 14 during the thinning process of the semiconductor substrate, polishing is preferred instead of the ion implantation process.

The thus obtained composite wafer 7 is then subjected to patterning using conventional photolithography technique. Specifically, photo resist was applied and dried on a surface 6a of the donor substrate 6 and light is irradiated onto the photo resist through a photo mask (mask exposure). It was then immersed into developing solution to remove unnecessary photo resist. In the case that the photo resist is a negative resist, a part of the photo resist with light irradiated thereon is left on the donor substrate 6. On the other hand, in the case that the photo resist is a positive resist, a part of the photo resist, onto which light is not irradiated, is left on the donor substrate 6. Then, the surface region of the donor substrate 6, which is not covered with the photo resist, is removed by etching.

The thickness of the composite wafer is decided on JEITA or SEMI standard. For example, the thickness may be made 0.525 mm in the case of a 4-inch wafer, the thickness may be made 0.625 mm in the case of a 6-inch wafer and the thickness may be made 0.725 mm in the case of an 8-inch wafer.

(Embodiments of Bonding)

As a technique used for the bonding, it may be used direct bonding through surface activation and substrate bonding technique using an adhesive layer, for example, although it is not particularly limited.

As the direct bonding, it may be appropriately used low-temperature bonding technique through surface activation. After the surface activation is performed in vacuum using O2 or N2 gas plasma, a single crystalline material, such as Si, can be bonded to a polycrystalline material through an adhesive layer such as $SiO_2$ at ambient temperature.

As an example of the adhesive layer, $SiO_2$, $Al_2O_3$ and SiN are used in addition to the adhesion with a resin.

EXAMPLES

Inventive Example 1

For confirming the effects of the present invention, a translucent alumina ceramics was used to produce a handle substrate of 8-inch, according to the procedure described referring to FIG. 3, and the handle substrate was evaluated.

First, for producing a blank substrate made of a translucent alumina ceramics, it was prepared slurry by mixing the following ingredients.

(Powdery Raw Material)

α-alumina powder having a specific surface area of 3.5 to 4.5 $m^2/g$ and an average primary particle size of 0.35 to 0.45 μm 100 weight parts

| | |
|---|---|
| MgO (magnesia) | 0.025 weight parts |
| $ZrO_2$ (zirconia) | 0.040 weight parts |
| $Y_2O_3$ (yttria) | 0.0015 weight parts |
| (Dispersing medium) | |
| Dimethyl glutarate | 27 weight parts |
| Ethylene glycol | 0.3 weight parts |
| (Gelling agent) | |
| MDI resin | 4 weight parts |
| (Dispersing agent) | |
| High molecular surfactant | 3 weight parts |
| (Solvent) | |
| N,N-dimethylaminohexanol | 0.1 weight parts |

The slurry was cast into a mold made of an aluminum alloy at room temperature and then maintained at room temperature for 1 hour. It was then maintained at 40° C. for 30 minutes for the solidification and then released from the mold. It was further maintained at room temperature and 90° C. for 2 hours, respectively, to obtain a plate-like powder molded body.

The thus obtained powder molded body was calcined (preliminary sintering) in air at 1100° C., then sintered in atmosphere of hydrogen 3: nitrogen 1 at 1750° C., and then annealed under the same condition to produce the blank substrate.

However, according to the present example, it was provided a portion for forming a notch inside of the metal mold for gel cast molding, so that the notch was formed in the molded body. The shape of the portion for forming the notch was adjusted so that it could be obtained the notch in conformity with SEMI standard after sintering shrinkage.

The thus produced blank substrate was subjected to high-precision polishing. First, both faces were subjected to lapping using green carbon to adjust the shape, and the both surfaces were then subjected to lapping using diamond slurry. The diamond particle size was made 3 μm. It was finally performed CMP polishing using SiO2 abrasives and diamond abrasives and cleaning. In the cleaning, it was performed RCA cleaning used in conventional semiconductor cleaning process.

It was measured a surface roughness of the bonding face 3 by AFM to obtain Ra value of 1.5 nm (in a visual field of □70 μm). It was confirmed that the average grain size of the sintered body was 30 μm by a laser microscope.

Further, the surface roughness Ra of the notch was proved to be 0.3 μm.

As a result, the number of particles having a size of 2 μm or larger after the cleaning was proved to be 5 counts per one handle substrate of 8 inches.

Comparative Example 1

A handle substrate was produced according to the same procedure as the Inventive Example 1.

However, the notch was not formed in the step of gel cast molding. Instead, the notch was formed by grinding before the CMP processing.

It was measured a surface roughness of the bonding face by AFM to obtain Ra value of 1.5 nm (in a visual field of □70 μm). It was confirmed that the average grain size of the sintered body was 30 μm by a laser microscope.

Further, the surface roughness Ra of the notch was proved to be 0.8 μm.

As a result, the number of particles having a size of 2 μm or larger after the cleaning was proved to be about 200 counts per one handle substrate of 8 inches.

The invention claimed is:

1. A handle substrate of a composite wafer for a semiconductor: said handle substrate comprising a polycrystalline ceramic sintered body;
    wherein said handle substrate comprises an outer peripheral portion comprising a notch; and
    wherein said notch comprises an as-sintered surface.

2. The handle substrate of claim 1, wherein said as-sintered surface has a surface roughness Ra of 0.5 μm or lower.

3. The handle substrate of claim 1, wherein said as-sintered surface is formed by gel cast molding.

4. The handle substrate of claim 1, wherein said polycrystalline ceramic sintered body is produced by sintering a tape-shaped molded body obtained by die cutting process using a metal mold having a desired shape, and wherein said as-sintered surface is molded by said die cutting of said tape shaped molded body.

5. The handle substrate of claim 1, wherein said polycrystalline ceramic sintered body comprises a translucent alumina.

6. The handle substrate of claim 1, in conformity with SEMI standard.

7. A composite wafer for a semiconductor, said composite wafer comprising said handle substrate of claim 1 and a donor substrate bonded to a bonding face of said handle substrate.

8. The composite wafer of claim 7, wherein said donor substrate comprises a silicon single crystal.

* * * * *